United States Patent
Huang et al.

(10) Patent No.: US 9,997,646 B2
(45) Date of Patent: Jun. 12, 2018

(54) SOLAR CELL, AND SOLAR CELL MODULE EMPLOYING THE SAME

(71) Applicant: Industrial Technology Research Institute, Hsinchu (TW)

(72) Inventors: Lee-May Huang, Tainan (TW); Yu-Wei Chuang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 427 days.

(21) Appl. No.: 13/974,077

(22) Filed: Aug. 23, 2013

(65) Prior Publication Data

US 2014/0053889 A1 Feb. 27, 2014

(30) Foreign Application Priority Data

Aug. 24, 2012 (TW) .............................. 101130824 A

(51) Int. Cl.
| | |
|---|---|
| *H01L 31/0224* | (2006.01) |
| *H01L 31/0216* | (2014.01) |
| *H01L 31/048* | (2014.01) |
| *H01L 31/068* | (2012.01) |
| *H01L 31/046* | (2014.01) |

(52) U.S. Cl.
CPC .......... *H01L 31/022425* (2013.01); *H01L 31/02167* (2013.01); *H01L 31/046* (2014.12); *H01L 31/048* (2013.01); *H01L 31/0481* (2013.01); *H01L 31/068* (2013.01); *Y02E 10/547* (2013.01)

(58) Field of Classification Search
CPC .................. H01L 31/048; H01L 31/02167

USPC ........................................................ 136/256
See application file for complete search history.

(56) References Cited

U.S. PATENT DOCUMENTS

| | | | |
|---|---|---|---|
| 4,492,736 A * | 1/1985 | Tanner .......................... | 428/446 |
| 5,304,509 A | 4/1994 | Sopori | |
| 5,571,392 A * | 11/1996 | Sato et al. ..................... | 204/296 |
| 7,659,475 B2 | 2/2010 | Agostinelli et al. | |
| 7,868,405 B2 | 1/2011 | Brabec et al. | |
| 7,993,700 B2 | 8/2011 | Zhou et al. | |
| 8,062,964 B2 | 11/2011 | Tsai et al. | |
| 8,076,175 B2 | 12/2011 | Meier et al. | |
| 8,101,231 B2 | 1/2012 | Hampden-Smith et al. | |
| 8,168,462 B2 | 5/2012 | Borden et al. | |
| 2003/0215626 A1 * | 11/2003 | Hiller ................... | B01D 67/003 428/304.4 |

(Continued)

FOREIGN PATENT DOCUMENTS

| | | |
|---|---|---|
| CN | 100487925 | 5/2009 |
| CN | 100570905 | 12/2009 |

(Continued)

OTHER PUBLICATIONS

Lim, et al., Journal of Applied Physics, 2007, vol. 101, 104309.*

(Continued)

*Primary Examiner* — Sadie White
(74) *Attorney, Agent, or Firm* — JCIPRNET

(57) ABSTRACT

A solar cell is provided. The solar cell includes a first electrode, a second electrode, and a photoelectric conversion layer, disposed between the first electrode and the second electrode. The solar cell further includes an ionizable charged film disposed on one of the outermost surface of the first electrode and the outermost surface of the second electrode.

12 Claims, 8 Drawing Sheets

(56) References Cited

U.S. PATENT DOCUMENTS

| | | | |
|---|---|---|---|
| 2005/0109389 A1* | 5/2005 | Middelman et al. | 136/256 |
| 2005/0279401 A1 | 12/2005 | Arhart et al. | |
| 2006/0207645 A1* | 9/2006 | Wada | 136/244 |
| 2010/0132774 A1 | 6/2010 | Borden | |
| 2010/0154883 A1 | 6/2010 | Komatsu et al. | |
| 2010/0263720 A1 | 10/2010 | Detje et al. | |
| 2010/0275983 A1* | 11/2010 | Kaes | H01L 31/022425 136/255 |
| 2010/0294335 A1 | 11/2010 | Huang et al. | |
| 2010/0311203 A1 | 12/2010 | Borden et al. | |
| 2011/0048515 A1 | 3/2011 | Englert et al. | |
| 2011/0132423 A1* | 6/2011 | Joge | H01L 31/0236 136/244 |
| 2011/0166299 A1* | 7/2011 | Kashiwagi | H01G 7/023 525/381 |
| 2011/0232761 A1 | 9/2011 | Lomasney | |
| 2011/0240114 A1 | 10/2011 | Stewart et al. | |
| 2012/0024336 A1 | 2/2012 | Hwang | |
| 2012/0097236 A1 | 4/2012 | Hu et al. | |
| 2012/0140310 A1* | 6/2012 | Huang | H01L 31/046 359/265 |
| 2013/0056712 A1* | 3/2013 | Jain | H01L 31/02167 257/40 |
| 2013/0206219 A1* | 8/2013 | Kurtin et al. | 136/255 |
| 2013/0210186 A1 | 8/2013 | Hiraike et al. | |

FOREIGN PATENT DOCUMENTS

| | | | |
|---|---|---|---|
| CN | 101833213 | 9/2010 | |
| CN | 102017097 | 4/2011 | |
| EP | 1675188 | 6/2006 | |
| JP | 2010-067920 | 3/2010 | |
| TW | 201037846 | 10/2010 | |
| WO | 2011021982 | 2/2011 | |
| WO | 2011041653 | 4/2011 | |
| WO | WO 2011068857 A2 * | 6/2011 | H01L 31/02167 |
| WO | 2011126660 | 10/2011 | |
| WO | 2012066848 | 5/2012 | |
| WO | WO 2012018649 A3 * | 5/2012 | |

OTHER PUBLICATIONS

Makableh, et al., Applied Physics Letters, 2013, vol. 102, 051904.*
B. Hoex, et al., "On the c-Si surface passivation mechanism by the negative-charge-dielectric Al2O3", Journal of Applied Physics, vol. 104, No. 11, Dec. 1, 2008, pp. 113703-1-113703-7.
Pierre Saint-Cast, et al., "Very low surface recombination velocity on p-type c-Si by high-rate plasma-deposited aluminum oxide", Applied Physics Letters, vol. 95, No. 15, Oct. 14, 2009, pp. 151502-1-151502-33.
Jun Wang, et al., "Substrate dependence of surface passivation using atomic layer deposited dielectrics", IEEE, 34th Photovoltaic Specialists Conference (PVSC), Jun. 7-12, 2009, pp. 001988-001991.
Ivan Mora-Sero, et al., "Impedance spectroscopy characterisation of highly efficient silicon solar cells under different light illumination intensities", Energy & Environmental Science, vol. 2, Mar. 17, 2009, pp. 678-686.
Tomihisa Tachibana, et al., "Material Research on High-Quality Passivation Layers with Controlled Fixed Charge for Crystalline Silicon Solar Cells", Japanese Journal of Applied Physics, vol. 50, Apr. 20, 2011, pp. 04DP091-1-04DP091-4.
M. Garin, et al., "Characterization of a-Si:H/c-Si interfaces by effective-lifetime measurements", Journal of Applied Physics, vol. 98, No. 9, Nov. 9, 2005, pp. 093711-1-093711-9.
M. Bahr, et al., "Influence of a Thermally Grown SiO2 Interface on the Passivation Quality of PECVD ALOX-SINX Passivation Layers for Perc Solar Cells", Preprint, 26th EU PVSEC, Hamburg, Sep. 2011, pp. 1-4.
H. Haug, et al., "Analysis of A-SINX:H Passivated Si Surfaces Based on Injection Level Dependent Lifetime and Capacitance/Conductance-Voltage Measurements", 26th European Photovoltaic Solar Energy Conference and Exhibition, Sep. 5-9, 2011, pp. 1524-1529.
Joseph Mandelkorn, et al., "A new electric field effect in silicon solar cells", Journal of Applied Physics, vol. 44, No. 10, Oct. 1973, pp. 4765-4787.
Jan Schmidt, et al., "Surface passivation of silicon solar cells using plasma-enhanced chemical-vapour-deposited SiN films and thin thermal SiO2/plasma SiN stacks", Semiconductor Science and Technology, vol. 16, 2001, pp. 164-170.
Ralf Ludemann, "Hydrogen passivation of multicrystalline silicon solar cells", Materials Science and Engineering: B, vol. 58, Issues 1-2, Feb. 12, 1999, pp. 86-90.
A. Descoeudres, et al., "Improved amorphous/crystalline silicon interface passivation by hydrogen plasma treatment", Applied Physics Letters, vol. 99, No. 12, 2011, pp. 123506-1-123506-3.
Jan Schmidt, et al., "Surface passivation of silicon solar cells using industrially relevant Al2O3 deposition techniques", Photovoltaics International, Nov. 2010, pp. 52-57.
Scott C. Warren, et al., "Plasmonic solar water splitting", Energy & Environmental Science, vol. 5, 2012, pp. 5133-5146.
S. Vitanov, et al., "Two-dimensional numerical optimization of MIS solar cell on n-type silicon", 23rd European Photovoltaic Solar Energy Conference, Sep. 1-5, 2008, Valencia, Spain, pp. 1743-1745.
J. C. Muller, et al., "Hydrogen ion passivation of multicrystalline silicon solar cells", Revue de Physique Appliquee (Paris), vol. 22, No. 7, Jul. 1987, pp. 649-654.
"Office Action of Japan Counterpart Application", dated Jul. 15, 2014, p. 1-p. 2.
"Office Action of China Counterpart Application," dated Aug. 3, 2015, p. 1-p. 12.
"Office Action of Taiwan Counterpart Application", dated Oct. 1, 2015, p. 1-p. 5.
"Notice of Allowance of China Counterpart Application" , dated Jan. 8, 2016, p. 1-p. 4.
"Search Report of Europe Counterpart Application", dated Dec. 7, 2017, p. 1-p. 8.

* cited by examiner

SOLAR CELL, AND SOLAR CELL MODULE EMPLOYING THE SAME

CROSS-REFERENCE TO RELATED APPLICATION

This application claims the priority benefit of Taiwan application serial no. 101130824, filed on Aug. 24, 2012. The entirety of the above-mentioned patent application is hereby incorporated by reference herein and made a part of this specification.

TECHNICAL FIELD

The technical field relates to a solar cell and a solar cell module employing the same.

BACKGROUND

The theoretical efficiency of a solar cell is high, but the actual power generation efficiency is not the case. There are many factors affecting the cell efficiency, such as series and parallel resistances of the solar cell itself, the shielding of sunlight by the solar cell electrodes, or the loss caused by not effectively capturing the reflected light, etc.

The recombination of electrons and holes inside solar cell is another important factor affecting the cell efficiency. The absorption of incident photons having greater energy than the band gap of a solar cell creates electron-hole pairs, and these carriers are separated by the action of the electric field existing at the p-n junction of the solar cell. The light-generated minority carriers (i.e. electrons or holes in the electron-hole pairs) reach the p-n junction, and sweep across the junction, wherein they become majority carriers. If the solar cell is short-circuited, the light-generated carriers flow through an external circuitry to complete a circuit. The power generation efficiency of solar cell is affected by the recombination rate of electrons and holes in the cell, resulting in depletion of charge carriers.

Standard silicon solar cell composes of a base silicon region, an emitter silicon region, p-n junction region, front electrical contact (front electrode) and rear electrical contact (rear or back electrode). In recent years, several type of high-efficiency crystalline silicon solar cells, such as heterojunction with intrinsic thin layer (HIT), passivated emitter and rear cell (PERC), and passivated emitter rear locally diffused cell (PERL) solar cells have been developed to improve the said recombination loss.

Dielectric passivation is a commonly used method to minimize the carriers recombination at the surface of a solar cell. The passivation materials include any suitable materials capable of holding either positive or negative charges. The application of charges with a reverse polarity with respect to the semiconductor emitter or base layer can create electric field that repels minority carriers from moving through the solar cell, thereby reducing the carriers' recombination. The two well-known surface passivation methods are chemical passivation and field-effect passivation.

The chemical passivation includes depositing a dielectric material on the surface of a n-type or p-type semiconductor with a thermal oxidation process, which is one of the high-temperature (e.g. 1000° C.) surface passivation techniques. The thermal oxidation process provides a good interface passivation quality through chemical bonding between the dielectric layer and the semiconductor, and results in defect density reduction at the interface of the semiconductor/dielectric layer, thereby lowering the recombination probability of the electrons and holes on a semiconductor surface. However, the high temperature condition may cause carriers lifetime degradation and dopants redistribution at the n+/p interface. The thermal oxidation process can be replaced by plasma-enhanced chemical vapor deposition (PECVD) method, in which the plasma is excited at a lower temperature of about 400° C., and some unstable defects of the solar cell are repaired with hydrogen.

The field-effect passivation approach adopts dielectric material to inhibit the recombination of minority carriers. The surface passivation property of a dielectric layer depends crucially on the fixed charges in the dielectric layer and the doping concentration of the semiconductor. For n-type semiconductor, silicon nitride having positive charges induces majority carriers (electrons) accumulation at the dielectric/semiconductor interface, causing the energy bands to bend downward. The minority carriers (holes) are shielded from the crystalline silicon solar cell surface.

Another type of field-effect passivation forms a heavily-doped p+ region as a barrier on the back surface of a p-type semiconductor, so as to prevent the minority carriers (electrons) from moving to the back contact. A back surface field (BSF) which consists of a higher doped region at the rear surface of a solar cell, is one kind of such passivation. The electric field formed at the interface between the high and low doped regions induces a barrier that repels minority carriers from first electrode. However, sometimes additional doping with acceptor-type dopant required to form the p+ region, demands extra manufacturing steps and higher processing costs.

From the view of structure, the dielectric passivation layer formed by both the chemical passivation and the field-effect passivation methods directly contacts the semiconductor photoelectric conversion layer of a solar cell.

In contrast to the above mentioned dielectric passivation, the word "passivation" has another meaning in term of solar cell reliability. Polymer encapsulant is one of the well known materials to provide an electrically insulating passivation layer with respect to an electrically conductive layer applied thereto, such as an electrode layer. This polymer encapsulant adheres to both the cathode and the anode of the solar cell simultaneously, to provide durable, long-lasting protection for solar cell against environmental hazards.

Presently, there are several types of polymer encapsulants available, including ethylene vinyl acetate (EVA), polyvinyl butyral (PVB), polydimethyl siloxane (PDMS), thermoplastic polyolefins (TPO), thermoplastic polyurethane (TPU), ethylene propylene diene monomer (EPDM) and ionomer. According to Kempe's study "Overview of scientific issues involved in selection of polymers for PV applications" presented at the 37$^{th}$ IEEE Photovoltaic Specialist Conference (2011); the volume resistivities of EVA, TPU and polyolefin are of the order of E14 Ohm/sq, while silicone, ionomer and EPDM are about 100 times more resistive than EVA. The resistivity of polymer encapsulant is relevant to electrical insulation.

It is worth mentioning that an ionomer is a charged copolymer containing both electrically neutral repeating units and a fraction of ionizable ionic group covalently bonded to the polymer backbone. In this type of polymer, the ionic association mainly contributes to the thermoplastic properties of the material. Below the melt temperature, this polymer aligns to form physical crosslinking due to ionic groups attraction. However at elevated temperature this ionic interaction disappears and the polymer chain will move around freely. This thermally reversible thermoplastic behavior allows the ionomer to have easy processibility at elevated temperature and high modulus at room temperature, thus making the ionomer suitable for solar cell encapsulant applications.

SUMMARY

In an exemplary embodiment, a solar cell is provided. The solar cell includes a first electrode, a second electrode and a photoelectric conversion layer disposed between the first electrode and the second electrode. An ionizable charged film is disposed on one of the outermost surface of the first electrode and the outermost surface of the second electrode.

In an exemplary embodiment, a solar cell module having an ionizable charged film is introduced. The solar cell module at least includes a plurality of solar cells, and an encapsulant. Each solar cell includes a first electrode with an outermost surface and an inner surface, a second electrode with an outermost surface and an inner surface opposite to the inner surface of the first electrode, a photoelectric conversion layer disposed between the inner surface of the first electrode and the second electrode, and an ionizable charged film disposed on one of the outermost surface of the first electrode and the outermost surface of the second electrode. The encapsulant adheres to the ionizable charged film.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
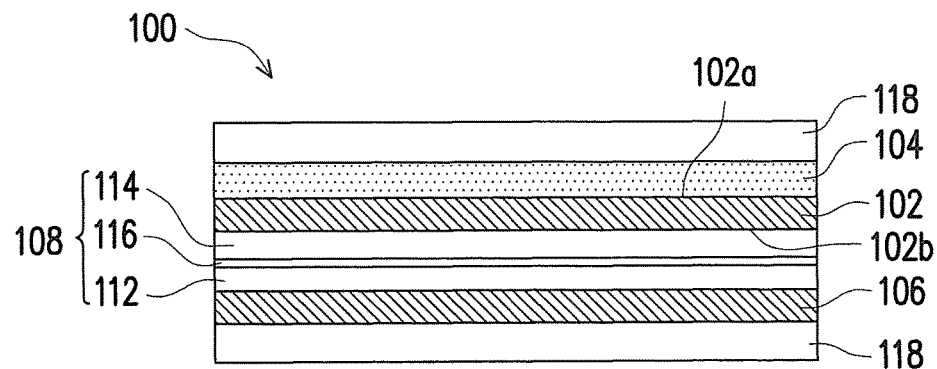
FIG. 1 is a schematic diagram illustrating a solar cell according to a first embodiment.

FIG. 1 is a schematic diagram illustrating a solar cell according to a first embodiment.

In FIG. 1, the solar cell 100 at least includes a first electrode 102 with an outermost surface 102a, and an inner surface 102b, a second electrode 106 with an outermost surface and an inner surface, a photoelectric conversion layer 108 disposed between the inner surface 102b of the first electrode 102 and the inner surface of the second electrode 106, and an ionizable charged film 104 disposed on one of the outermost surface 102a of the first electrode 102 and the outermost surface of the second electrode 106. The photoelectric conversion layer 108 may include a semiconductor base region 112, a semiconductor emitter region 114, and a p-n junction region 116. The p-n junction region 116 is disposed between the semiconductor base region 112 and the semiconductor emitter region 114.

The solar cell 100 of the disclosure comprises crystalline silicon solar cell, amorphous silicon thin film solar cell, amorphous and microcrystalline silicon thin film solar cell, copper indium gallium selenide (CIGS) or cadmium telluride (CdTe) solar cell.

Referring to FIG. 1, the first electrode 102 and the second electrode 106 may be a cathode or an anode of the solar cell 100, and vice versa. The ionizable charged film 104 provides charge control on the first electrode 102. Another ionizable charged film (not shown) can also be disposed on the second electrode 106 to manipulate the charge distribution on the second electrode 106.

The ionizable charged film 104 composes of equal number of cations (positively charged ions) and anions (negatively charged ions). For example, the ionizable charged film 104 comprises an organic or an inorganic charged thin film.

This ionizable charged film 104 forms electric double layer when contacted with an electrode. The ionizable charged film will either create anions located close to positively charged electrode, or produce cations positioned next to negatively charged electrode.

The ionizable charged film 104 may have sole electrical contact with the cathode or the anode or both the cathode and the anode of a solar cell. However, due to the ionic conductivity of the ionizable charged film 104, the ionizable charged film deposited on both sides of the electrode should not contact each other. Unexpected connection to both the cathode and anode will result in short circuit to device. The electrical polarity of the ionizable charged film 104 opposes that of majority carriers of the semiconductor (i.e. the semiconductor base region 112 or the semiconductor emitter region 114).

The inorganic ionizable charged film comprises lithium phosphorus oxynitride (LIPON), $LiClO_4$, $LiCF_3SO_3$ or $LiBF_4$. The organic ionizable charged film comprises polyelectrolyte.

In the case of organic charged thin film, when dissolved in polar solvent, this charged polymer can dissociate into polymer backbone having fixed charges and mobile ions with opposite polarity, leaving positively or negatively charges on polymer backbone and releasing its counter ion in the solution. The fraction of ionizable ionic group determines the ionic conductivity of the charged polymer.

Examples of negatively charged polymer thin film include poly(styrene sulfonate acid) (PSSA), poly(acrylic acid) (PAA), polymaleic acid (PMA) or poly(perfluorosulfonic acid) (PFSA), whereas the positively charged polymer thin film includes polydiallyldimethylammonium chloride (PDDA), poly(allylamine hydrochloride) (PAH), poly-L-lysine (PLL) or polyethyleneimine (PEI).

For practical application, the solar cell 100 is often electrically connected and encapsulated as a module. Polymers such as ethylene vinyl acetate (EVA), polyvinyl butyral (PVB), polydimethyl siloxane (PDMS), polyolefins (TPO), thermoplastic polyurethane (TPU), ethylene propylene diene monomer (EPDM) or ionomer can be used as encapsulant 118 for the solar cell module lamination process. The encapsulant 118 adheres to both the ionizable charged film 104 and the second electrode 106 of the solar cell 100, and may contact the electrodes with different polarity simultaneously. In the first embodiment, since the ionizable charged film 104 had been disposed in advance on the first electrode 102 of the solar cell 100; thus the encapsulant 118 is sequentially laminated on the ionizable charged film 104. Moreover, if the ionizable charged film 104 is optionally disposed on the outermost surface of the second electrode 106, the encapsulant 118 may adhere on the ionizable charged film 104 disposed on the outermost surface of the second electrode 106.

Figure 2:
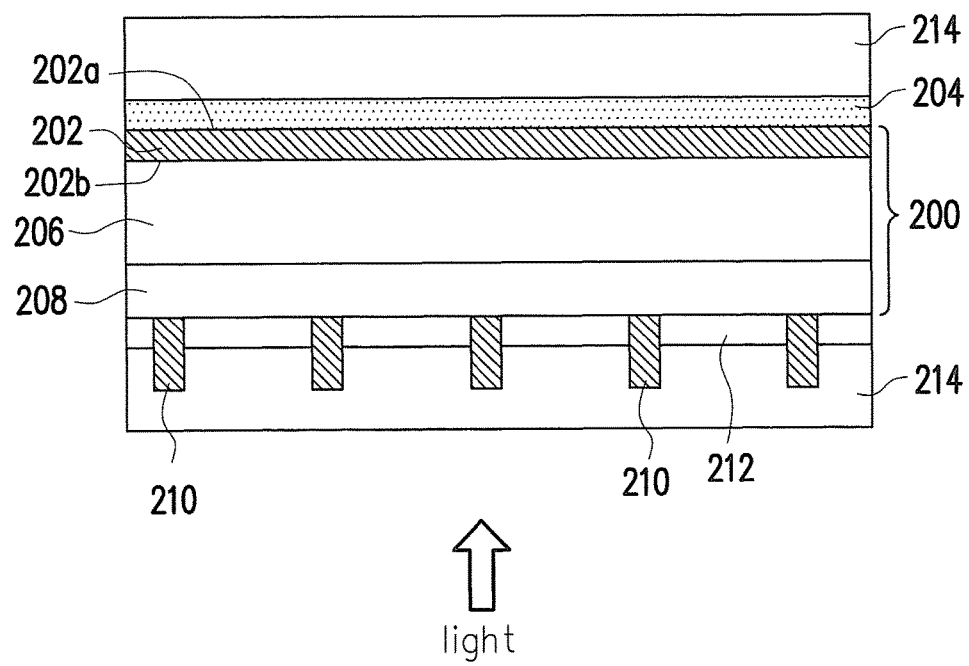
FIG. 2 is a schematic diagram illustrating a solar cell according to a second embodiment.

FIG. 2 is a schematic diagram illustrating a solar cell according to a second embodiment.

In FIG. 2, a solar cell 200 has a first electrode 202, and an ionizable charged film 204. The ionizable charged film 204 is disposed on an outermost surface 202a of the first electrode 202. A crystalline silicon solar cell is taken as an example to illustrate the solar cell 200 of the second embodiment, in which the first electrode 202 is a back electrode (e.g. a metal electrode), and the light is incident to the front side of the solar cell 200, but it is not limited thereto. Here the first electrode 202 refers to the electrode located in opposite side with respect to incident light direction. Since the ionizable charged film 204 is disposed on the outermost surface 202a of the first electrode 202, the ionizable charged film 204 can be fabricated at back-end modules production stage. The polarity of the ionizable charged film 204 substantially depends on the conductivity type (p-type or n-type) of a semiconductor base region 206 in contact with the inner surface 202b of the first electrode 202. The polarity of the ionizable charged film 204 opposes that of the majority carriers of the semiconductor base region connected to the inner surface 202b of the first electrode 202. In this case, the polarity of the semiconductor base region is p-type semiconductor layer and thus, the ionizable charged film 204 is negatively charged. For example, in the crystalline silicon solar cell of FIG. 2, the semiconductor base region 206 in the photoelectric conversion layer is a p-type semiconductor layer in contact with the inner surface 202b of the first electrode 202, and an semiconductor emitter region 208 (e.g. n-type semiconductor emitter layer) in the photoelectric conversion layer is disposed on the p-type semiconductor layer (206). The ionizable charged film 204 induces electric field repulsion on minority charge carriers (electrons) from the back side of the solar cell 200, and reduces recombination losses at the rear surface of the crystalline silicon solar cell. The ionizable charged film 204 can be a single-layer or a multi-layer structure.

Referring to FIG. 2, since a crystalline silicon solar cell is taken as an example to illustrate the solar cell 200 of the second embodiment, a second electrode (e.g. a plurality of metal grid electrodes) 210 can be disposed on the front side of the solar cell 200 to efficiently transmit the solar cell output power to an external loading. An anti-reflection layer 212 can also be disposed on the semiconductor emitter region 208 beside the second electrode 210 to capture sunlight incident to the front side of the solar cell 200.

In the second embodiment, since the ionizable charged film 204 is negatively charged, this film 204 can affect the energy band gap of the semiconductor base region 206 in contact with the first electrode 202.

Figure 3:
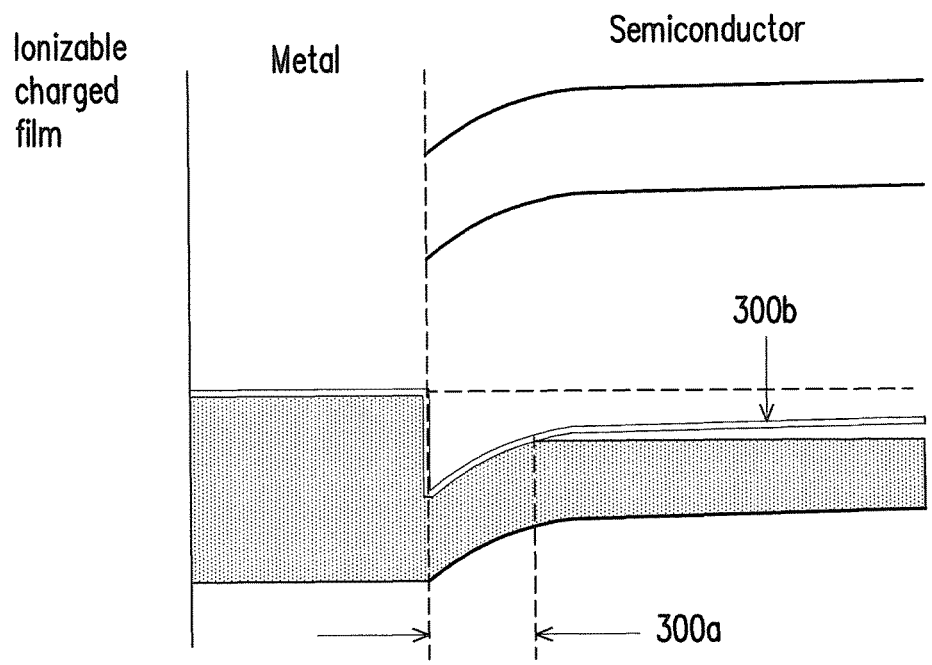
FIG. 3 a schematic energy band diagram at the interface between the solar cell and the first electrode of FIG. 2.

FIG. 3 explains the possible passivation scheme of the ionizable charged film 204 on a crystalline silicon solar cell. For a crystalline silicon solar cell with metal (such as aluminium paste) as the first electrode 202, electrons flow from the metal into the empty states in the valence band of the p-type semiconductor layer (e.g. the semiconductor base region 206 in FIG. 2), resulting in upward band bending as the chemical potential comes into equilibrium with the metal Fermi level. This equilibrium condition leads to the formation of a region that has been depleted of holes, and a potential barrier is built up for holes to reach the interface with the metal, as shown is FIG. 3. When an ionizable charged film with negative polarity is deposited on the outermost surface of the metal electrode, the charges of the ionizable charged film induces negative charges on the interface between the metal electrode and the p-type semiconductor layer. The holes are attracted toward the interface which results in a reduced of space charge width 300a and potential barrier for holes 300b. Accordingly, if the metal electrode is a first electrode, the amount of minority carriers (electrons) moving to the back side of the solar cell would be decreased, i.e., the carrier recombination is reduced and the possibility of extracting holes is increased, thereby improving the characteristics of the whole device.

In the second embodiment, the ionizable charged film 204 composes of equal number of cations (positively charged ions) and anions (negatively chargeds ions). The components in the ionizable charged film 204 includes inorganic ions and organic ions. Lithium phosphorus oxynitride (LI-PON), $LiClO_4$, $LiCF_3SO_3$ or $LiBF_4$, are some example of inorganic ions. Organic ionizable charged film includes polyelectrolyte, this group of polymer can dissociate in solution, leaving charges on polymer chains which carries either positively charged polycations or negatively charged polyanions, and releasing counterions. Examples of polyanions include poly(styrene sulfonate acid) (PSSA), poly (acrylic acid) (PAA), polymaleic acid (PMA) or poly(perfluorosulfonic acid) (PFSA), whereas polycations includes polydiallyldimethylammonium chloride (PDDA), poly(allylamine hydrochloride) (PAH), poly-L-lysine (PLL) or polyethyleneimine (PEI).

Moreover, the solar cell 200 may be electrically connected and encapsulated as a module. For example, polymers such as EVA, PVB, PDMS, TPO, TPU, EPDM or ionomer can be used as encapsulant 214 for the solar cell module lamination process. The encapsulant 214 adheres to the ionizable charged film 204, the plurality of metal grid electrodes 210 and the anti-reflection layer 212 of the solar cell 200, and may contact the electrodes with different polarity simultaneously. In the second embodiment, since the ionizable charged film 204 had been disposed in advance on the first electrode 202 of the solar cell 200; thus the encapsulant 214 is sequentially laminated on the ionizable charged film 204.

Figure 4:
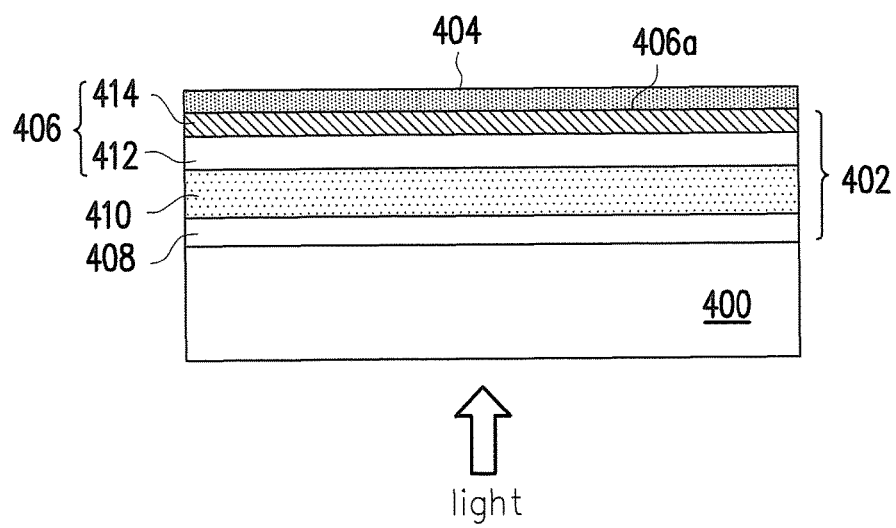
FIG. 4 is a schematic diagram illustrating a solar cell according to a third embodiment.

FIG. 4 is a schematic diagram illustrating a thin film solar cell according to a third embodiment.

The thin-film solar cell according to the third embodiment may be an amorphous silicon (a-Si) thin-film solar cell, or an a-Si/mc-Si (amorphous/micro crystalline silicon) tandem type thin-film solar cell. As shown in FIG. 4, a thin film solar cell 402 and an ionizable charged film 404 are formed on a transparent substrate 400. The thin film solar cell 402 has a first electrode 406, and the ionizable charged film 404 is formed on an outermost surface 406a of the first electrode 406. A superstrate thin film solar cell is taken as an example to illustrate the thin film solar cell 402 of the third embodiment. The thin film solar cell 402 includes a second electrode (e.g. transparent conductive oxide layer) 408, a photoelectric conversion layer 410 and a first electrode (i.e. a cathode layer) 406 sequentially stacked on the substrate 400. The second electrode 408 refers to an electrode facing incident light. The first electrode 406 includes a transparent conductive oxide layer 412 and a metal electrode 414. The metal electrode 414 is optional, for a see-through type amorphous thin film solar cell, this metal electrode is omitted, thus the ionizable charged film 404 can also directly contact to the transparent conductive oxide layer 412. The ionizable charged film 404 can be selected with reference to the first or the second embodiment, and the details are not iterated herein.

Figure 5:
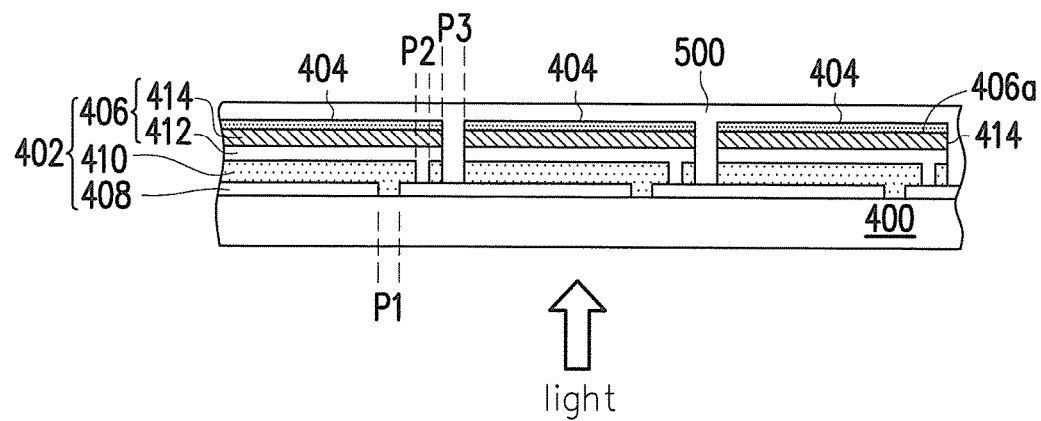
FIG. 5 is a schematic diagram illustrating a solar cell module according to a fourth embodiment.

FIG. 5 is a schematic diagram illustrating a module of solar cells according to a fourth embodiment.

The thin-film solar cell according to the fourth embodiment may be an amorphous silicon (a-Si) thin-film solar cell, an a-Si/mc-Si (micro crystalline silicon) tandem thin-film solar cell, or an a-Si/a-Si tandem thin-film solar cell. FIG. 5 is a schematic cross-sectional diagram showing a monolithic integrated thin film solar cell module with superstrate structure having an ionizable charged film as a dielectric passivation layer of the fourth embodiment, wherein same reference numerals as those according to the third embodiment represents the same or similar elements.

The monolithic integrated thin-film solar cell module is formed by a plurality of second electrodes 408 (i.e. anode layers) separated by p1 interval on a transparent substrate 400, a plurality of first electrodes 406 (i.e. cathode layers) separated by p3 interval on the second electrodes 408, and a plurality of photoelectric conversion layers 410 separated by p2 interval disposed in between the second electrodes 408 and first electrode 406. The second electrodes 408, for example, include a transparent conductive oxide layer, and the first electrodes 406 include a transparent conductive oxide layer 412 and a metal electrode 414. The second electrodes 408 of one thin-film solar cell are contacted to the first electrodes 406 of another thin-film solar cell, so that series connection between the thin-film solar cells is achieved. In the fourth embodiment, a plurality of ionizable charged films 404 contacts the first electrode 406. The ionizable charged film 404 can be selected with reference to one of the first to the third embodiments, and the details are not iterated herein. Moreover, an encapsulant 500 adheres to the ionizable charged film 404 and covers all of the thin film solar cells 402.

Figure 6:
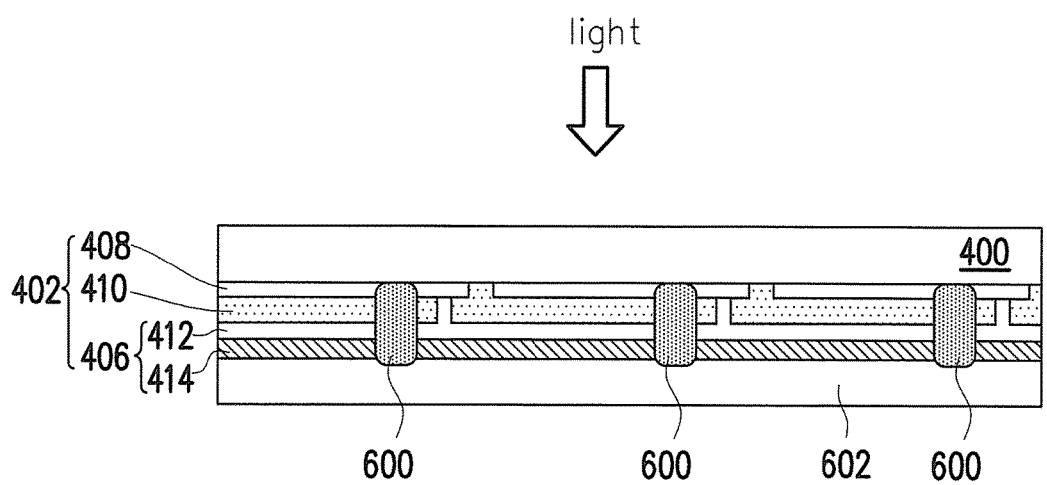
FIG. 6 is a schematic diagram illustrating a solar cell module according to a fifth embodiment.

FIG. 6 is a schematic diagram illustrating a solar cell module according to a fifth embodiment, wherein same reference numerals as those according to the fourth embodiment represents the same or similar elements.

The thin-film solar cell module according to the fifth embodiment is similar to that of the fourth embodiment, but the p3 interval is covered with an electrical insulating layer 600. In the fifth embodiment, a continuous layer of ionizable charged film 602 successively contacts a plurality of cathode layers 406 simultaneously.

Figure 7:
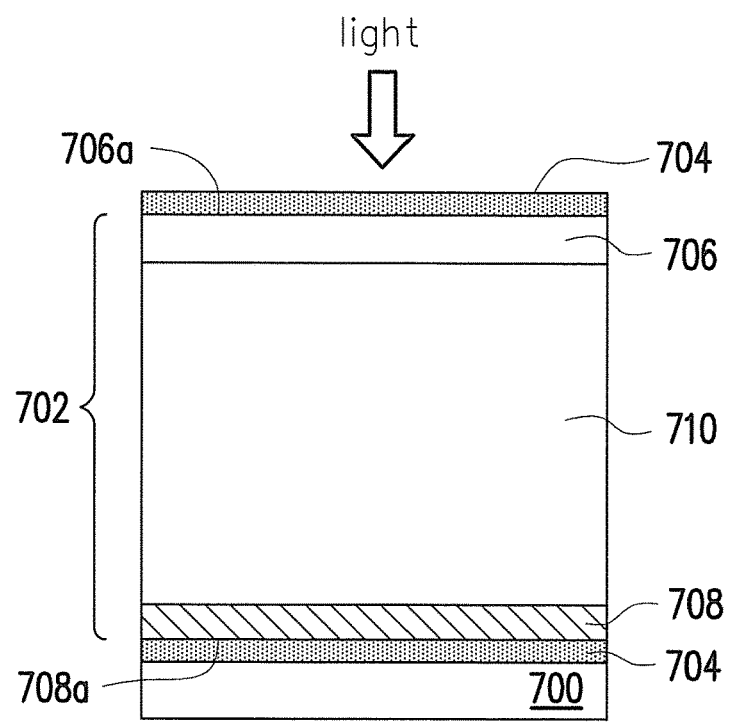
FIG. 7 is a schematic diagram illustrating a solar cell according to a sixth embodiment.

FIG. 7 is a schematic diagram illustrating a thin film solar cell according to a sixth embodiment.

As shown in FIG. 7, a thin film solar cell 702 and an ionizable charged film 704 are formed on a transparent substrate 700. The thin film solar cell 702 has a second electrode 706 and a first electrode 708. The ionizable charged film 704 is located not only on an outermost surface 708a of the first electrode 708 but also on an outermost surface 706a of the second electrode 706. A substrate structure thin film solar cell such as a copper indium gallium selenide (CIGS) or cadmium telluride (CdTe) solar cell is taken as an example to illustrate the solar cell 702 of the sixth embodiment. The thin film solar cell 702 includes a first electrode (i.e. an anode layer) 708, a photoelectric conversion layer 710 and a transparent second electrode (i.e. a cathode layer) 706 sequentially stacked on the substrate 700. The photoelectric conversion layer 710 comprises CIGS/CdS or CdTe/CdS heterojunctions. The ionizable charged film 704 can be selected with reference to the first or the second embodiment, and the details are not iterated herein.

Figure 8:
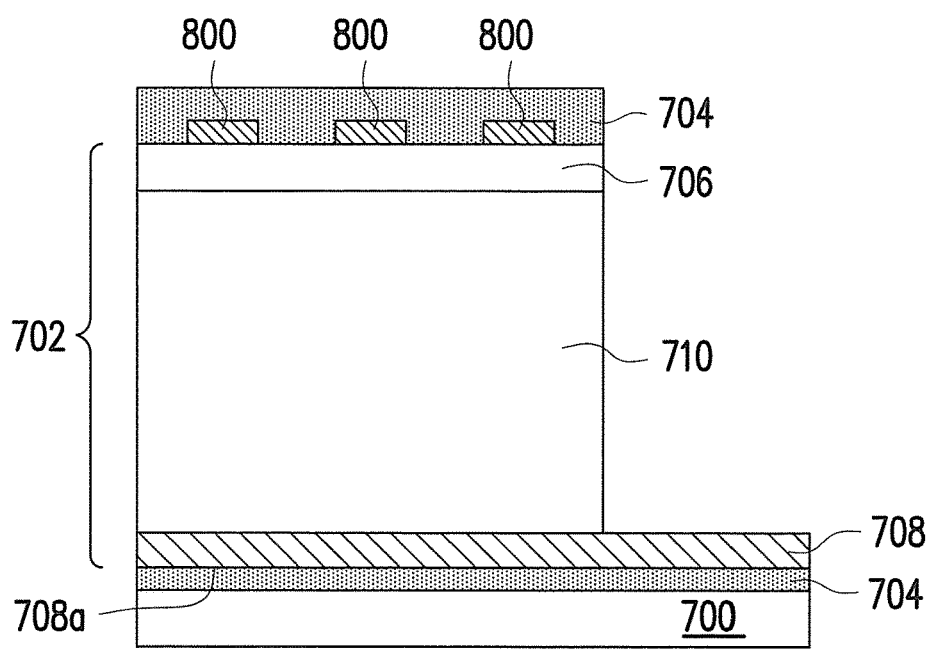
FIG. 8 is a schematic diagram illustrating a solar cell according to a seventh embodiment.

FIG. 8 is a schematic diagram illustrating a solar cell according to a seventh embodiment, wherein same reference numerals as those according to the sixth embodiment represents the same or similar elements.

The thin-film solar cell according to the seventh embodiment is similar to that of the sixth embodiment, but there is a plurality of metal contact line 800 on top of the transparent second electrode 706 (i.e. the cathode layer). The ionizable charged film 704 is deposited on the outermost surface of the second electrode 706, covering the second electrode 706 (e.g. transparent conducting oxide) and metal contact line 800 simultaneously.

The following experiments illustrated below prove the performance of the disclosure. A crystalline silicon (c-Si) solar cell, an amorphous silicon (a-Si) thin film solar cell and a CIGS thin film solar cell are taken as examples in the following experiments.

Experiment 1a: Volume Resistivity Measurements of Polymer Encapsulants

The volume resistivity measurements of several type of polymer encapsulants are carried out according to ASTM D257-07. The polymer encapsulants include: ethylene vinyl acetate (EVA), poly vinyl butyral (PVB) and ionomer. The measured volume resistivities of the EVA, PVB and surlyn ionomer are: 1.86 E14 Ohm·cm, 3.13 E12 Ohm·cm and 2.54 E17 Ohm·cm, respectively. This result indicates that Dupont surlyn ionomer has the highest volume resistivity.

Experiment 1b: Ionic Conductivity Measurements of Ionizable Charged Film

Positively charged polyelectrolyte: polyallylamine hydrochloride (PAH) and negatively charged polyelectrolyte: polystyrene sulfonate (PSS) are utilized as ionizable charged films. The concentrations of the ionic components in these charged thin films are between 20 mole percent to 85 mole percent. The ionic conductivities of the polyelectrolyte thin films are measured with electrochemical impedance spectroscopy (EIS) method, by sandwiching the ionizable charged film in between two platinum foil, with calibration by 12.9 mS/cm sodium chloride standard solution (from Thermo Electron). The measured ionic conductivities of polystyrene sulfonate (PSS) and polyallylamine hydrochloride (PAH) range between $10^{-3}$ to $10^{-6}$ S/cm.

The experiments 2 to 6 verify the effectiveness of the ionizable charged film as a dielectric passivation layer on several types of solar cells.

Experiment 2: Dielectric Passivation on c-Si Solar Cell

Preparation of an Ionizable Charged Film

First, an anionic polyelectrolyte is dissolved in water to form a charged polymer solution. In this example, the material is poly(styrene sulfonate acid) PSSA. 4 g of PSSA is dissolved in 10 cc of pure water, so that the PSSA solution can be ionized to form PSS$^-$ negatively charged polymer and H$^+$ positively charged counter ion.

Figure 9:
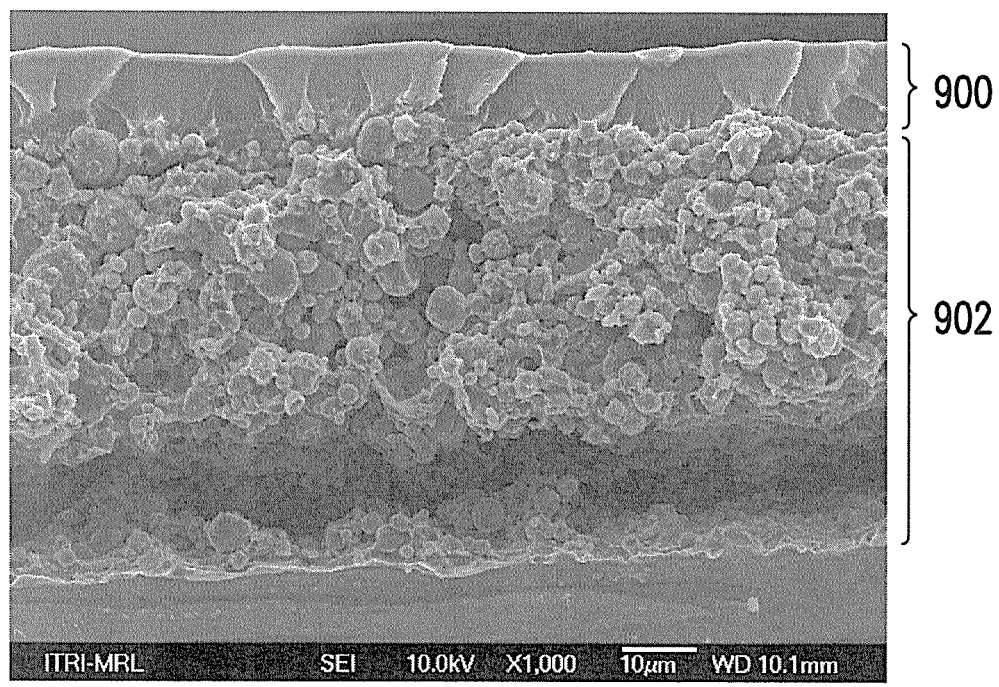
FIG. 9 is a scanning electron microscope (SEM) picture of a crystalline silicone solar cell according to experiment 2.

Fabrication of a crystalline silicon solar cell having an ionizable charged film as a passivation layer Thereafter, the PSSA solution is directly coated on the screen printed aluminum first electrode of a 6 inch silicon solar cell, according to the structure depicted in FIG. 2. Thereafter, the PSSA solution is dried to obtain negatively charged thin film on the first electrode. In this example, the screen printed aluminum electrode serves as the first electrode. FIG. 9 is a scanning electron microscope (SEM) image of the solar cell having an ionizable charged film as a passivation layer according to this experiment. The SEM picture shows an ionizable charged film 900 with a thickness of 9 micron and an aluminum paste first electrode 902 below the ionizable charged film 900. A portion of ionizable charged film penetrates into the first electrode during the coating process.

Measurement

In order to understand the passivation mechanism of the charged thin film for a crystalline silicon solar cell, AC impedance spectroscopy, reverse bias dark current, and I-V testings are conducted before the charged polymer solution is coated on the solar cell. The AC impedance spectroscopy and reverse bias dark current measurements are carried out in dark condition, by connecting the positive and negative terminals to the ribbons (that are soldered joint to the busbars) of the c-Si solar cell. The anode of the solar cell is connected to a positive terminal with respect to the cathode.

Thereafter, the AC impedance, dark current, and I-V testings of the solar cell after been coated with the ionizable charged film are conducted to analyze the effect of the ionizable charged film on the solar cell performance. All of these experiments are performed under controlled room temperature.

The I-V test results show that parameters such as open circuit voltage ($V_{oc}$), short circuit current ($I_{sc}$) and fill factor (FF) of the crystalline silicon solar cell are improved after the charged thin film is coated thereon. The short circuit current ($I_{sc}$) is increased by 1.23% from 8.580 A to 8.685 A. The open circuit voltage ($V_{oc}$) is increased by 0.96% from 0.625 V to 0.631 V. The fill factor (FF) is increased by 3.05% from 77.42% to 79.78%. The maximum output power ($P_{max}$) is increased by 3.13% from 4.15 W to 4.28 W.

Figure 10:
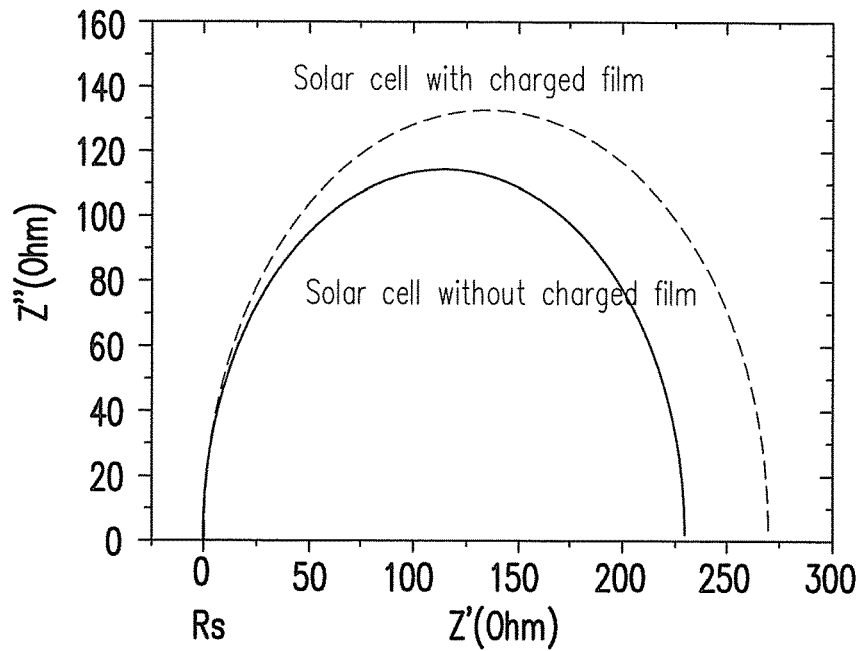
FIG. 10 is an AC impedance curve of a crystalline silicone solar cell with/without an ionizable charged film according to the experiment 2.

The AC impedance results are shown in FIG. 10. In FIG. 10, the series resistance (Rs) of the solar cell with charged thin film as a passivation layer is reduced, while the parallel resistance (Rsh) of the same solar cell is increased. This result reveals that the charged thin film is capable of reducing the leakage current of the c-Si solar cell.

Figure 11:
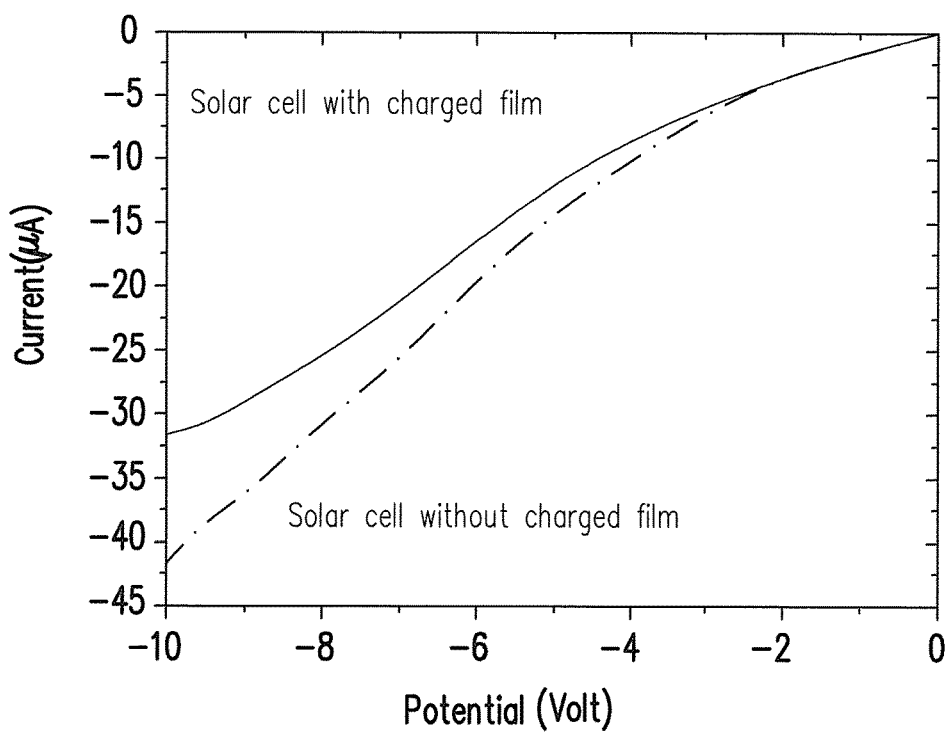
FIG. 11 is a reverse bias dark current curve of a crystalline silicone solar cell with/without an ionizable charged film according to the experiment 2.

The same result is obtained by measuring the dark current of the c-Si solar cell. FIG. 11 reveals that the dark current measured under a large reverse bias of −10 V shows a 23.85% reduction in dark current after coating the c-Si with ionizable charged film. The dark current is mainly due to the recombination loss of minority carriers. Lower dark current in c-Si solar cell with charged thin film indicates the improvement of recombination loss within the cell.

Experiment 3: Passivation on a-Si Thin Film Solar Cell

Fabrication of a see-through type amorphous crystalline silicon solar cell having an ionizable charged film as a dielectric passivation layer.

A 20 wt % of cationic polyelectrolyte: poly(allylamine hydrochloride) (PAH) in D.I. water is directly spin coated on the back electrode ZnO transparent conducting oxide (TCO) layer of an a-Si thin film solar cell module, according to the structure depicted in FIG. 5. The effect of the charged thin film on the a-Si thin film solar cell is studied by AC impedance spectroscopy, and reverse bias dark current tests prior to and after been coated with this positively charged polyelectrolyte. The anode of the solar cell is connected to a positive terminal with respect to the cathode. All of the measurements are carried under controlled room temperature in dark conditions.

Figure 12:
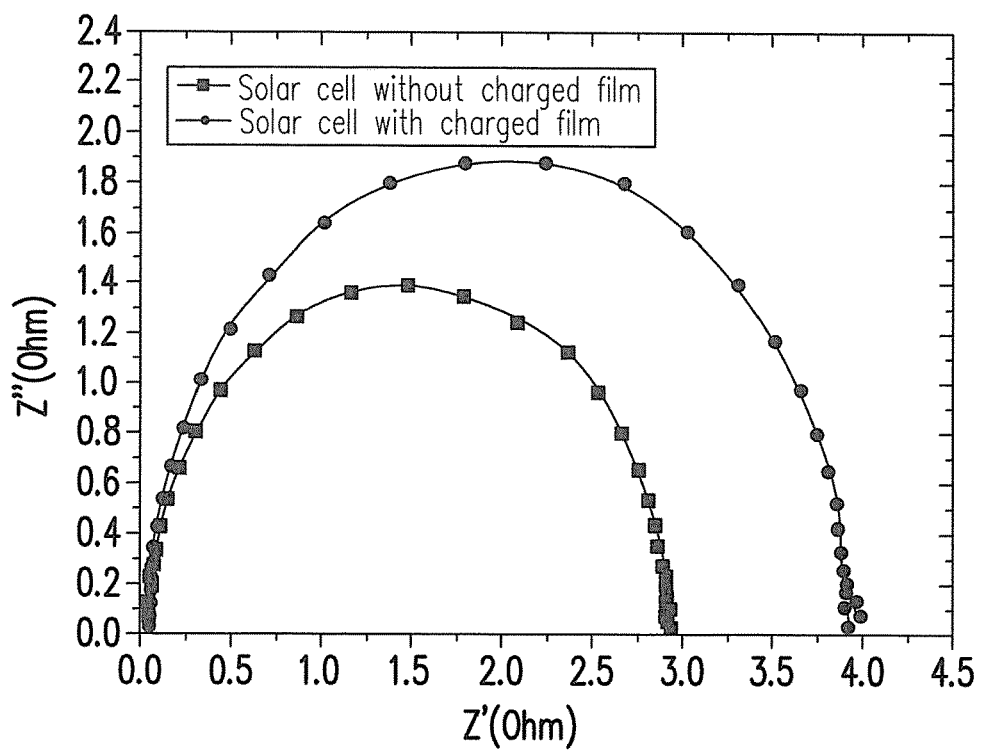
FIG. 12 is an AC impedance curve of an amorphous silicon thin film solar cell with/without an ionizable charged film according to the experiment 3.

The AC impedance analysis are shown in FIG. 12, the Nyquist plot shows that the series resistance (Rs) of the solar cell with ionizable charged film as a passivation layer is reduced, and at the same time the parallel resistance (Rsh) is increased. The results indicate lower Rs and higher Rsh are achieved after the coating process. According to the equations $Cp=1/(2\times\pi\times f\times Z''_{max})$, and lifetime=Rsh*Cp, the lifetime of the a-Si thin film solar cell can be calculated. Here Cp refers to the capacitance of the solar cell and f is the frequency measured at $Z''_{max}$. The result shows that there is a 2.48 times fold increase in lifetime for solar cell with ionizable charged film, compare to that without the coating layer.

Figure 13:
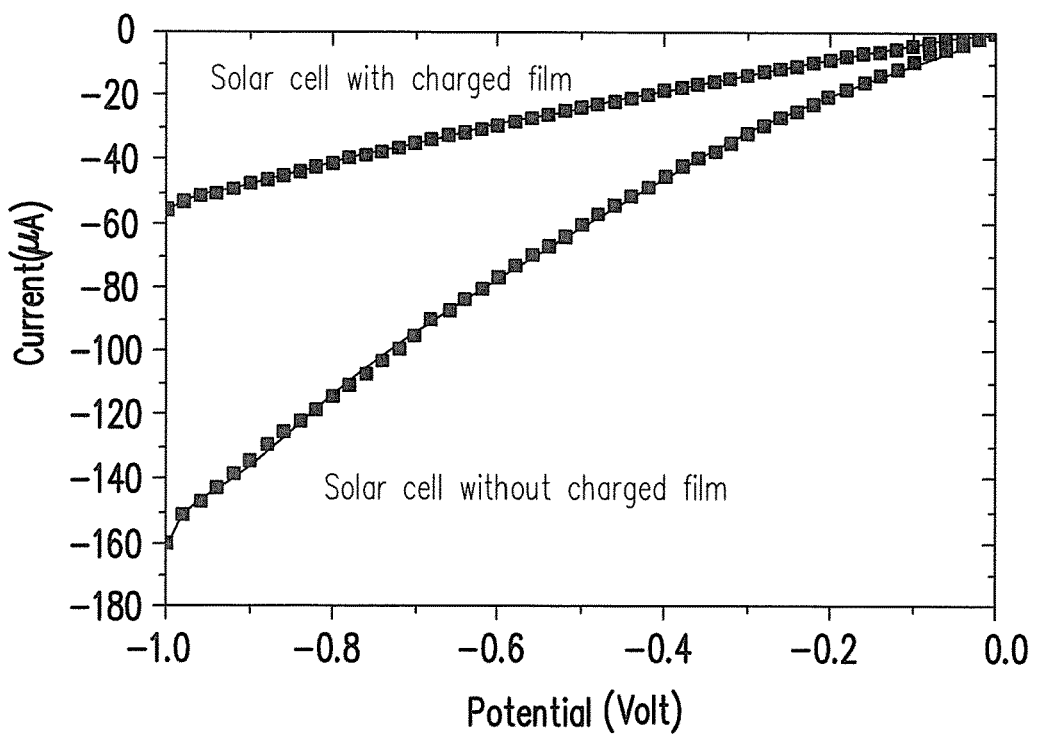
FIG. 13 is a reverse bias dark current curve of an amorphous silicon thin film solar cell with/without an ionizable charged film according to the experiment 3.

FIG. 13 shows the dark current measured under a reverse bias of −10 V. The result reveals a 65% reduction in dark current after coating the a-Si thin film solar cell with ionizable charged film.

Experiment 4: Passivation on a CIGS Thin Film Solar Cell

Fabrication of a CIGS thin film solar cell having an ionizable charged film as a dielectric passivation layer.

A 20 wt % of cationic polyelectrolyte: poly(allylamine hydrochloride) (PAH) in D.I. water is directly spin coated on the second electrode ZnO transparent conducting oxide of a CIGS thin film solar cell.

Figure 14:
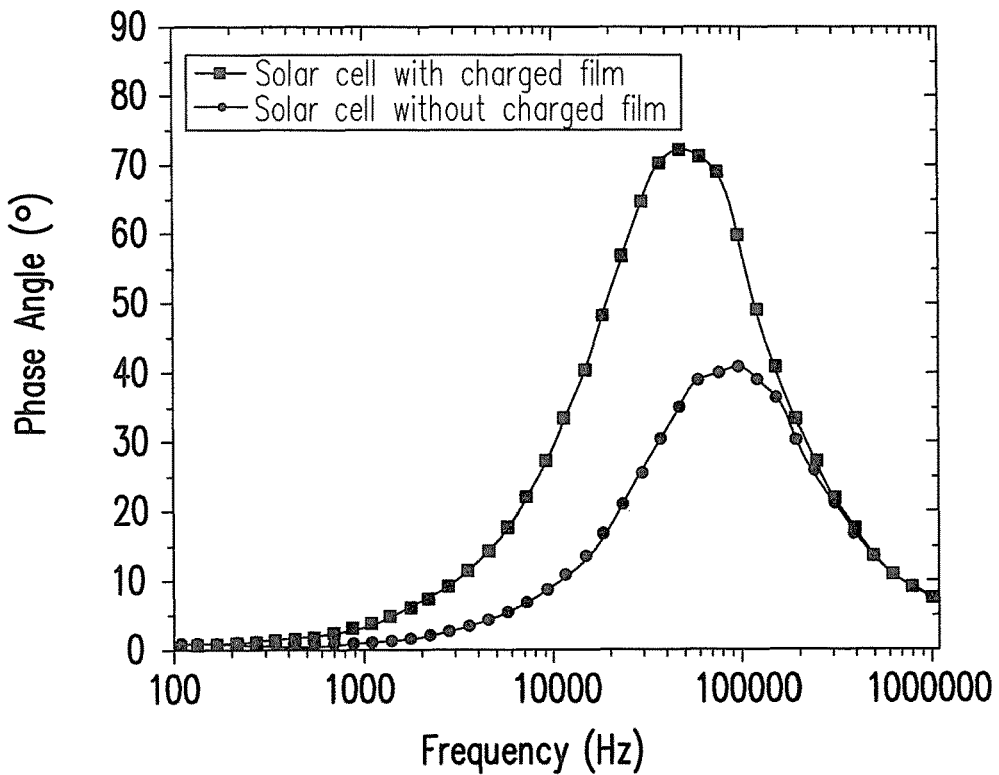
FIG. 14 is a Bode plot of a CIGS thin film solar cell with/without an ionizable charged film according to the experiment 4.

The Bode plot depicted in FIG. 14 shows the variation of the phase angle of the CIGS solar cell before and after the coating process. The peak of the phase angle of the solar cell with ionizable charged film moves to lower frequency, and the result indicates that the lifetime of this solar cell increase by 2.3 times fold compares to that without ionizable charged film.

Experiment 5 the Effect of Ionomer on the C-V Curve of a CIGS Cell

Figure 15:
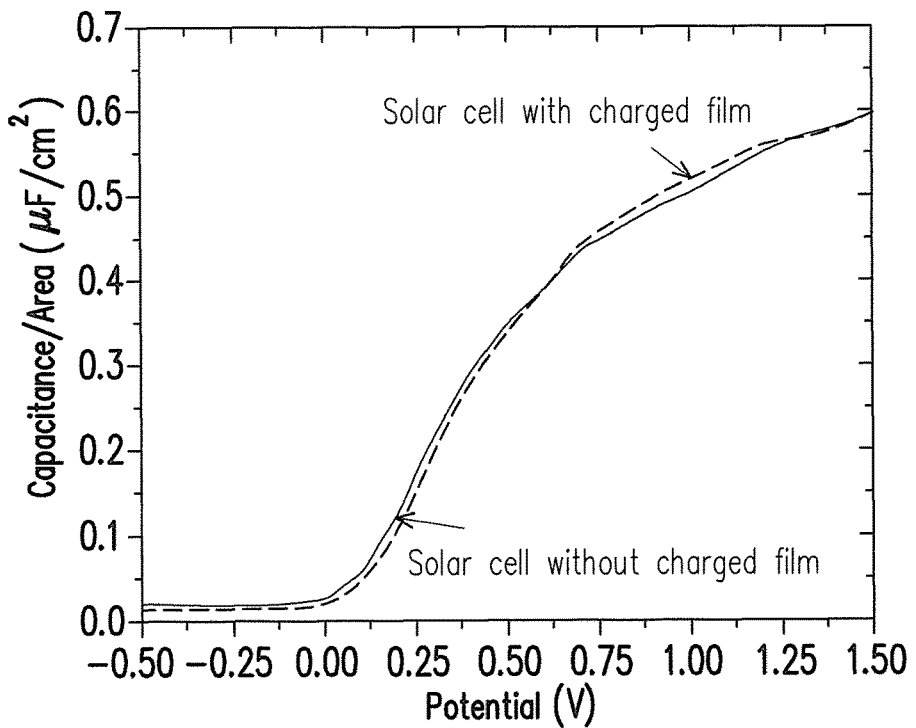
FIG. 15 is a C-V curve of a CIGS thin film solar cell in contact with Dupont surlyn ionomer according to the experiment 5.

FIG. 15 depicts the C-V curve of a CIGS solar cell (measured at a frequency of 100 Hz) prior to and after been coated with a layer of ionomer. No significant variation of the C-V curve is observed, which indicates that this type of charged polymer (surlyn ionomer) is an insulator. In contrast to ionizable charged film, ionomer layer will not induce any electric field charge on the surface of electrode. Hence, the ionomer has no dielectric passivation effect on solar cell.

In summary, in the passivation structure of the disclosure, a charged material is directly deposited on the electrode of a solar cell through coating process. The accumulated charges within the ionizable charged film cause energy band bending, so as to effectively create field-effect surface passivation on the solar cell. In addition, as compared to the known vacuum semiconductor process, the technique of the disclosure is cheaper and easier for production without causing serious environmental problems.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A solar cell, at least comprising:
a first electrode, wherein the first electrode comprises an outermost surface and an inner surface;
a second electrode, wherein the second electrode comprises an outermost surface and an inner surface;
a photoelectric conversion layer, disposed between the inner surface of the first electrode and the inner surface of the second electrode;
a first ionizable charged film, disposed directly on the outermost surface of the first electrode; and
a second ionizable charged film, disposed directly on the outermost surface of the second electrode, the first ionizable charged film deposited on the outermost surface of the first electrode is not in direct physical contact with the second ionizable charged film deposited on the outermost surface of the second electrode, and neither of the first ionizable charged film and the second ionizable charged film are in direct physical contact with the photoelectric conversion layer, wherein
each of the first ionizable charged film and the second ionizable charged film comprises lithium phosphorus oxynitride (LIPON), $LiClO_4$, $LiCF_3SO_3$, or $LiBF_4$.

2. The solar cell of claim 1, wherein the photoelectric conversion layer comprises a semiconductor base region, a semiconductor emitter region and a p-n junction region, wherein the p-n junction region is disposed between the semiconductor base region and the semiconductor emitter region.

3. The solar cell of claim 1, wherein the second electrode comprises a transparent conductive oxide.

4. The solar cell of claim 1, wherein the first electrode comprises a transparent conductive oxide, a metal layer, or a laminate layer having the transparent conductive layer and the metal layer.

5. The solar cell of claim 2, wherein an electrical polarity of the ionizable charged film opposes that of majority carriers of the semiconductor base region or the semiconductor emitter region in contact with the first electrode.

6. The solar cell of claim 1, wherein each of the first ionizable charged film and the second ionizable charged film has an ionic conductivity in a range between $10^{-3}$ to $10^{-6}$ S/cm.

7. The solar cell of claim 1, wherein the solar cell comprises crystalline silicon solar cell, amorphous silicon thin film solar cell, amorphous and microcrystalline silicon thin film solar cell, copper indium gallium selenide (CIGS) or cadmium telluride (CdTe) solar cell.

8. A solar cell module, at least comprising:
a plurality of solar cells, each of the solar cells comprises:
a first electrode, wherein the first electrode comprises an outermost surface and an inner surface;
a second electrode, wherein the second electrode comprises an outermost surface and an inner surface;
a photoelectric conversion layer, disposed between the inner surface of the first electrode and the inner surface of the second electrode;
a first ionizable charged film, disposed directly on the outermost surface of the first electrode; and
a second ionizable charged film, disposed directly on the outermost surface of the second electrode, the first ionizable charged film deposited on the outermost surface of the first electrode is not in direct physical contact with the second ionizable charged film deposited on the outermost surface of the second electrode, and neither of the first ionizable charged film and the second ionizable charged film are in direct physical contact with the photoelectric conversion layer, wherein each of the first ionizable charged film and the second ionizable charged film comprises lithium phosphorus oxynitride (LIPON), $LiClO_4$, $LiCF_3SO_3$, or $LiBF_4$; and
an encapsulant adhering on the first ionizable charged film and the second ionizable charged film.

9. The solar cell module of claim 8, wherein the photoelectric conversion layer comprises a semiconductor base region, a semiconductor emitter region and a p-n junction region, wherein the p-n junction region is disposed between the semiconductor base region and the semiconductor emitter region.

10. The solar cell module of claim 9, wherein an electrical polarity of each of the first ionizable charged film and the second ionizable charged film opposes that of majority carriers of the semiconductor base region or the semiconductor emitter region in contact with the first electrode.

11. The solar cell module of claim 8, wherein each of the first ionizable charged film and the second ionizable charged film has an ionic conductivity in a range between $10^{-3}$ to $10^{-6}$ S/cm.

12. The solar cell module of claim 8, wherein the solar cells independently comprise an amorphous silicon thin film solar cell, amorphous and microcrystalline silicon thin film solar cell, copper indium gallium selenide (CIGS) or cadmium telluride (CdTe) solar cell.

\* \* \* \* \*